United States Patent [19]
Seto et al.

[11] Patent Number: 5,459,653
[45] Date of Patent: Oct. 17, 1995

[54] VOLTAGE TO CURRENT CONVERTER WITH INDEPENDENT LOOP GAIN AND FREQUENCY CONTROL

[75] Inventors: Jim M. N. Seto, North York; Roger P. Colbeck, Whitby; Raymond Chau, Toronto; Simon C. F. Leung, Markham, all of Canada

[73] Assignee: ATI Technologies Inc., Thornhill, Canada

[21] Appl. No.: 80,111

[22] Filed: Jun. 23, 1993

[51] Int. Cl.[6] .................................................... H02M 7/00
[52] U.S. Cl. ............................................................ 363/73
[58] Field of Search ................................ 363/73, 60–61; 323/315, 300

[56] References Cited

U.S. PATENT DOCUMENTS 4,618,814  10/1986  Kato et al. ................................ 363/73
4,675,594   6/1987  Reinke ................................. 363/73 X
5,266,887  11/1993  Smith ..................................... 323/316

OTHER PUBLICATIONS

"Charge–Pump Phase–Lock Loops", Floyd Gardner, IEEE, Nov. 1980.

*Primary Examiner*—Peter S. Wong
*Attorney, Agent, or Firm*—Pascal & Associates

[57] ABSTRACT

A voltage to current converter is formed of a first current steering mirror which includes first binary weighted current mirror transistors and receives an input voltage signal and converts it to an output current. The converter also is formed of a second current mirror which generates a selectable output current, the second current mirror being formed of second binary weighted current mirror transistors. The output currents of the first current steering mirror and second current mirror are added and the sum is provided to the control input of a current controlled oscillator which can be used in a phase locked loop.

13 Claims, 6 Drawing Sheets

ND FREQUENCY CONTROL

VOLTAGE TO CURRENT CONVERTER WITH INDEPENDENT LOOP GAIN AND FREQUENCY CONTROL

FIELD OF THE INVENTION

This invention relates to signal generators and in particular to a current controlled oscillator for use in a phase locked loop.

BACKGROUND TO THE INVENTION

Phase locked loops utilize voltage controlled oscillators to maintain phase and frequency stability, wherein a control voltage resulting from a comparison between an output signal and a reference signal is used to control the phase and frequency of an oscillator. However it is common that rather than a voltage controlled oscillator, a current controlled oscillator is used, with a voltage to current converter feeding it, wherein the control voltage signal is applied to the voltage to current converter.

The input voltage to the converter is typically obtained from a charge pump and loop filter combination as described by F. Gardner in "Charge-Pump Phase Lock Loops", IEEE Transactions on Communications 28; 1849–58, November 1980. In a single V/I converter the single charge pump voltage is compared to a supply voltage or some process dependent voltage such as $V_T$ in a MOS. In the differential case, an output of a phase-frequency detector is a series of "up" and "down" pulses which are used to control a differential charge pump. These up and down pulses are proportional to the phase difference of the inputs to the detector. When connected to a differential charge pump, the result is a voltage difference which is also proportional to the phase difference of the inputs. This voltage difference is applied to a differential voltage to current converter, the output of which is applied to a current controlled oscillator.

A "pseudo-differential" scheme may be used where the input voltage is compared to a locally generated voltage reference. The differential and pseudo-differential schemes allow the current to be steered such that the minimum current is zero and the maximum current is equal to $\alpha_2$ (the frequency/current gain factor within the current controlled oscillator) times a well-controlled constant bias current.

To ensure loop stability across a wide range, to minimize jitter, and to control frequency acquisition times, it is often desirable to have the gain constant of the phase locked loop programmable. This is commonly accomplished by altering device sizes within the current controlled oscillator, by switching in delay elements within the current controlled oscillator, or by changing current mirror ratios within the voltage to current converter. The gain of the phase locked loop may be controlled by altering the bias current, the voltage to current gain constant and the current controlled oscillator gain constant. However this also affects the frequency of the oscillator. The maximum operating frequency is set by the gain constants and the minimum frequency is equal to zero.

SUMMARY OF THE INVENTION

The present invention provides independent control of both the frequency of the oscillator and the gain of the phase locked loop. The gain constant and frequency in the present invention are each separately digitally programmable.

In accordance with an embodiment of the present invention, a voltage to current converter is comprised of a first current steering mirror for receiving an input voltage signal and converting the voltage signal to an output current, and being comprised of first binary weighted current mirror transistors, a second current mirror for generating a selectable output current, the second current mirror being comprised of second binary weighted current mirror transistors, apparatus for adding the output currents, and apparatus for providing the added output currents to a control input of a current controlled oscillator.

In accordance with another embodiment of the invention, a converter is comprised of a voltage to current converter, apparatus for controlling the gain of the voltage to current converter, a separate current generator, apparatus for controlling current emitted from the current generator, apparatus for adding output current signals of the voltage to current converter and the current generator and for providing a sum signal to a current controlled oscillator.

In accordance with another embodiment of the invention, a phase locked loop is comprised of a phase-frequency detector, apparatus for providing a reference signal and a controlled signal to the detector, apparatus for providing a voltage signal resulting from the detector detecting a difference between the phases of the reference and controlled signals, a first current steering mirror for receiving the voltage signal and converting the voltage signal to an output current, and being comprised of first binary weighted current mirror transistors, a second current mirror for generating a selectable output current, the second current mirror being comprised of second binary weighted current mirror transistors, apparatus for adding the output currents, apparatus for providing the added output currents to a control input of a current controlled oscillator, and apparatus for providing an output signal of the oscillator as the controlled signal to the detector.

BRIEF INTRODUCTION TO THE DRAWINGS

A better understanding of the invention will be obtained by reference to the detailed description below, in conjunction with the following drawings, in which:

FIG. 1 is a block diagram of a phase locked loop in accordance with the prior art, FIG. 2 is a more detailed block diagram of the analog portion of a phase locked loop in accordance with the prior art, FIG. 3a is a block diagram of the voltage to current converter and current controlled oscillator in accordance with the prior art, FIG. 3b is a more detailed illustration of a typical current converter with a current controlled oscillator, FIG. 4a is a block diagram of the voltage to current converter and current controlled oscillator in accordance with the present invention, FIG. 4b is a diagram of the present invention, and FIG. 5 is a graph of frequency/voltage transfer curves.

DETAILED DESCRIPTION OF THE INVENTION

Figure 1:
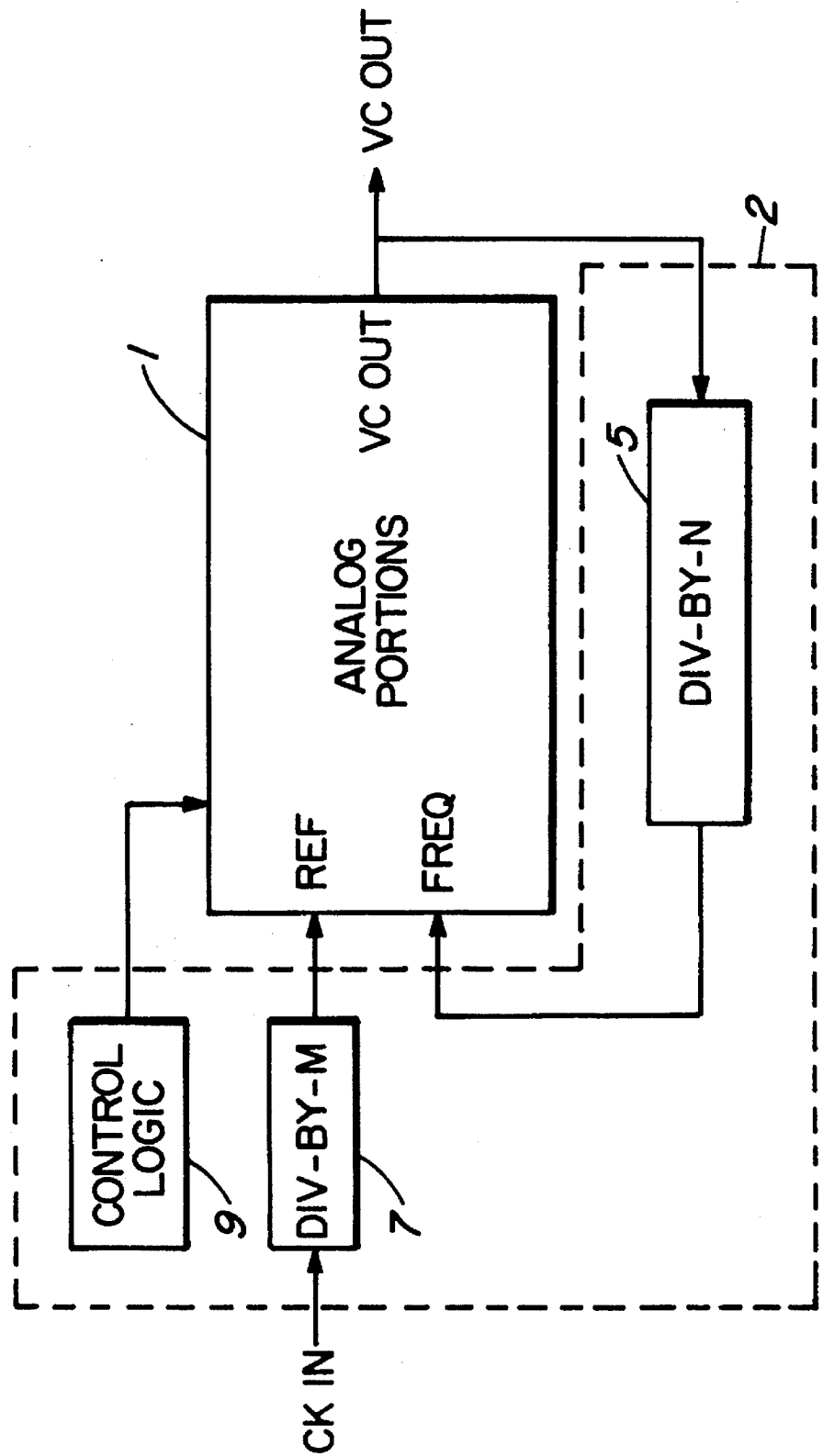

A typical phase locked loop is shown in FIG. 1. This structure is comprised of an analog portion 1 having a reference input (for receiving a clock signal) and a frequency input (for receiving a comparison signal), and a controlled voltage output signal Vcout. The phase locked loop includes a digital portion 2 which includes a divide by N counter 5, which presents a signal to the frequency input of the analog portion 1 in phase with the output signal. Clock signal Ckin is provided to an optional divide by M counter 7, the output of which is applied to the reference input of the analog portion. Control logic 9 controls the operation of the analog portion 1.

Figure 2:
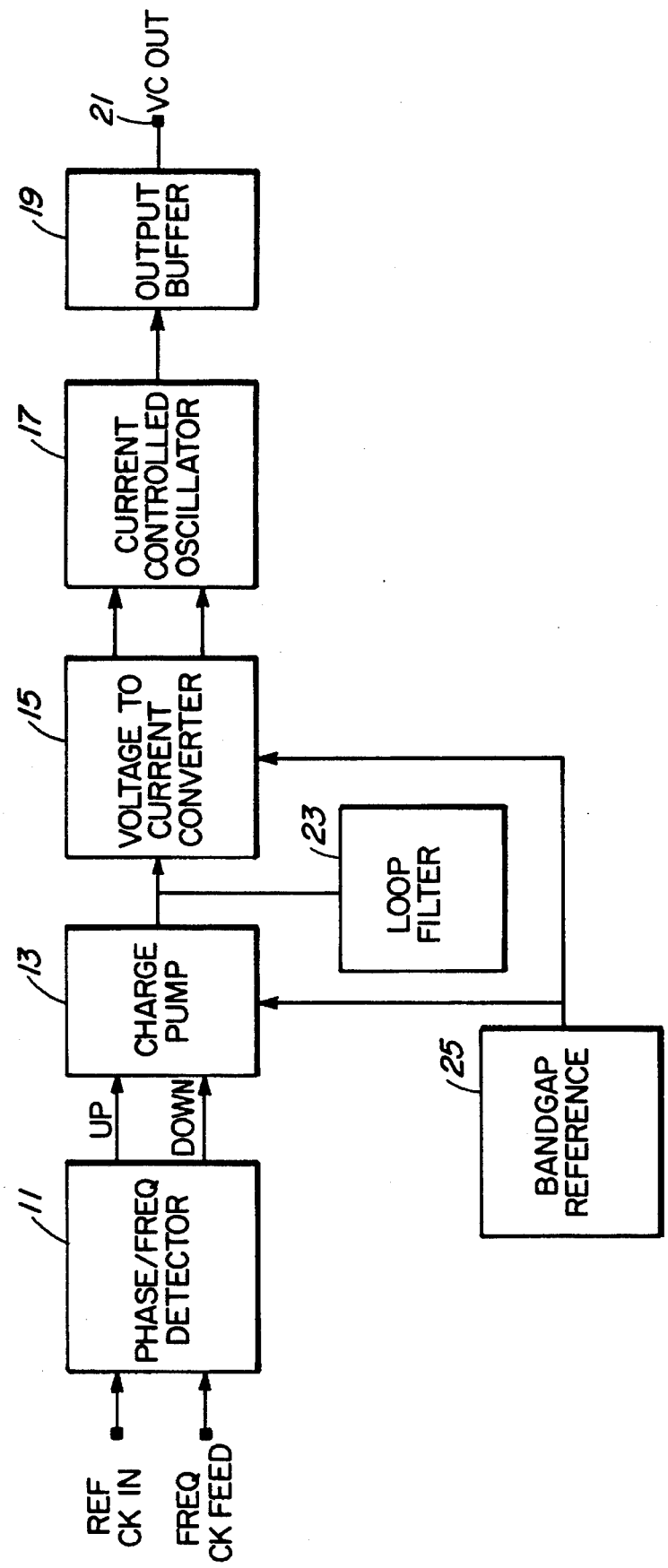

FIG. 2 is a more detailed block diagram of the analog portion 1. A phase-frequency detector 11 receives the Ckin reference and Ckfeed frequency inputs, and outputs up and down signals to a charge pump 13. The output of the charge pump is a control voltage for application to a voltage controlled oscillator, the output voltage of which is proportional to the phase difference between the reference signal Ckin and the feedback signal Ckfeed at the frequency input.

Rather than utilizing a voltage controlled oscillator, current control oscillators are often used as shown in FIG. 2. A voltage to current converter 15 receives the output signal voltage of the charge pump 13 and provides a control signal current to current controlled oscillator 17. The output of oscillator 17 is applied to an output buffer 19, if the buffer is not already part of the oscillator 17, to provide a controlled output signal Vcout 21.

A loop filter 23 is connected at the output of charge pump 13, and a voltage reference circuit is connected to the charge pump 13 and converter 15.

Operation of the above-described circuit is well known and is described in "Charge-Pump Phase Lock Loops" by F. Gardner, IEEE Transactions on Communications, Vol. Com-28, No 11, November 1980.

Figure 3A:
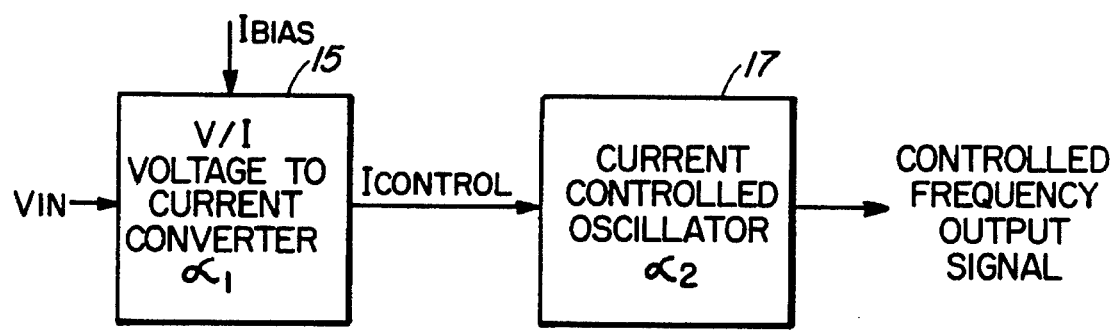
Figure 3B:
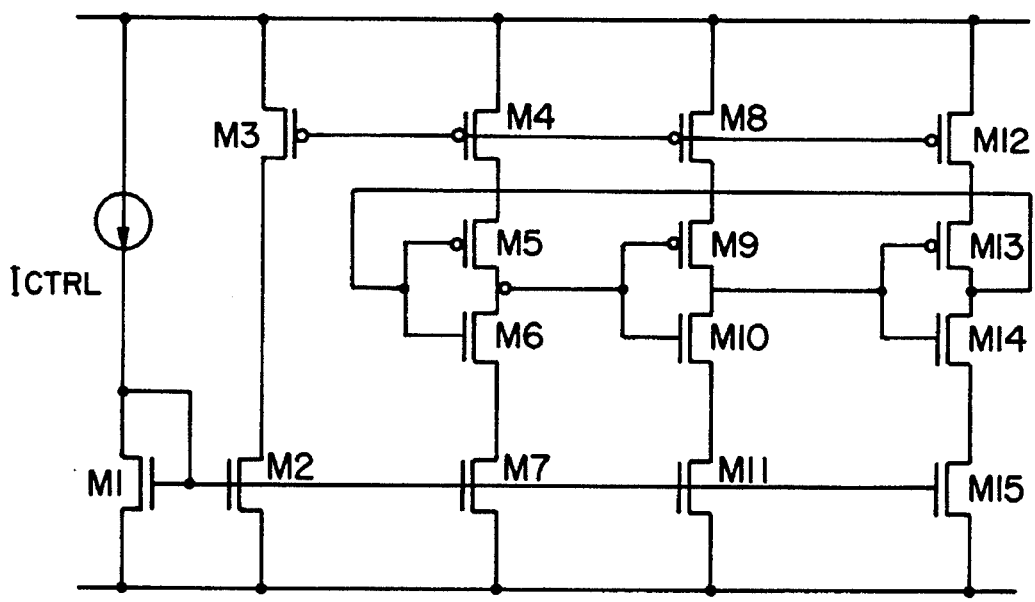

Turning to FIG. 3a, a prior art voltage to current converter 15 is illustrated, the current control signal output being connected to the input of a current controlled oscillator 17. Input signals to converter 15 are the control voltage from the charge pump 13 and a bias current $I_{bias}$, from a reference voltage current. FIG. 3b is a more detailed illustration of a typical current converter with a current controlled oscillator.

The gain of the phase locked loop is controlled by a number of factors, including contributing factors $\alpha_1$ and $\alpha_2$ in which $\alpha_1 = \Delta I/\Delta V$, the current/voltage gain factor within the voltage to current converter 15, and $\alpha_2 = \Delta f/\Delta I$, the frequency/current gain factor within the current controlled oscillator.

In accordance with this prior art configuration, the frequency of the output signal of current controlled oscillator $f = V_{in}.\alpha_1.\alpha_2 I_{bias}$. In order to vary the gain of the loop, the bias current is required to be varied, or the V/I gain constant, and the current controlled oscillator gain constant. However these variations affected the frequency range of the oscillator.

The present invention provides apparatus for digitally programming the gain constants and the frequency control. A block diagram of the present invention is shown in FIG. 4a.

In the present invention a current steering mirror 30 receives the control voltage and bias current $I_{bias1}$ as inputs. A programmable digital gain control signal is applied to current steering mirror 30. A current mirror 32 receives a programmable digital frequency offset control signal, as well as a current bias $I_{bias2}$.

The outputs of current mirrors 30 and 32 are summed in adder 34, and the sum is applied to current controlled oscillator 36, the output of which is the controlled frequency output signal.

Figure 4A:
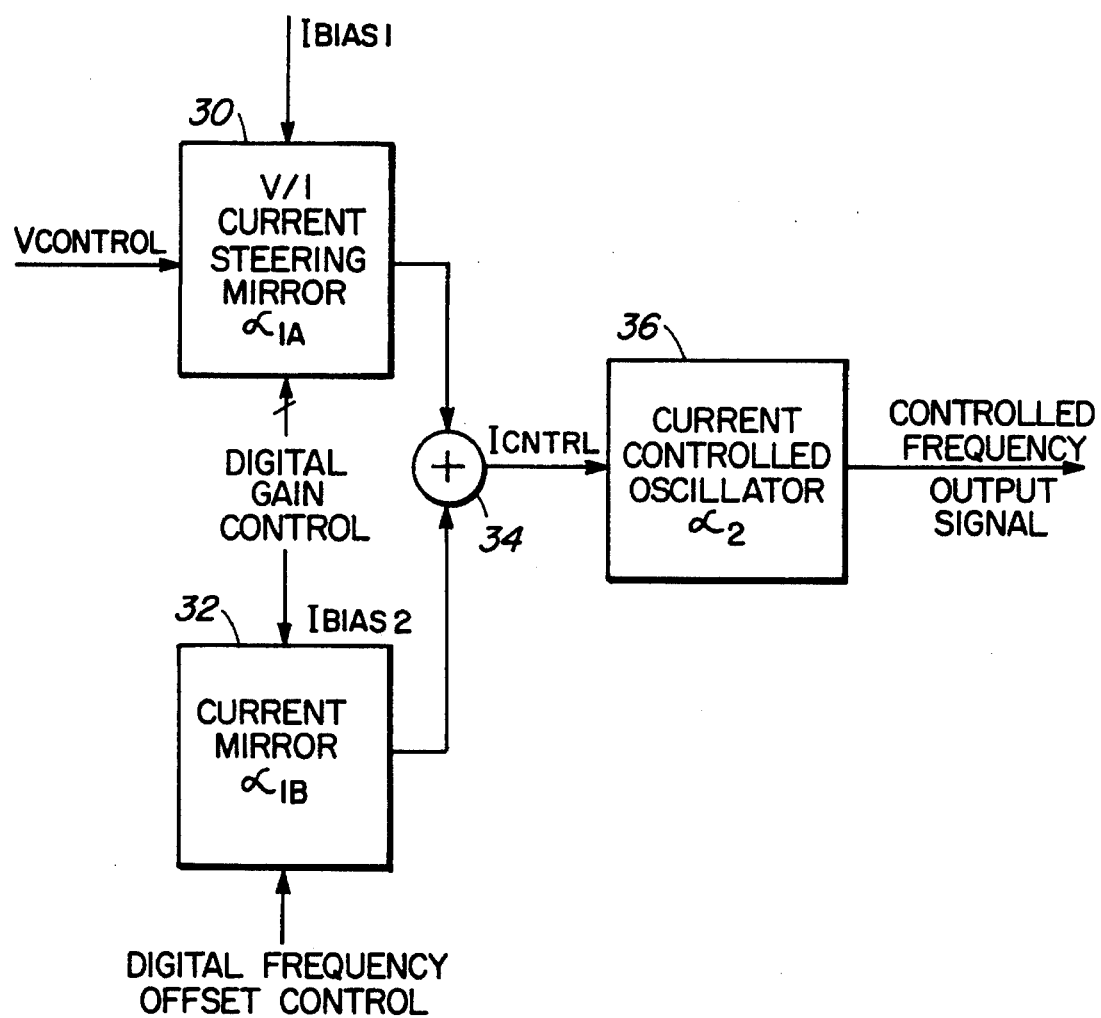
Figure 4B:
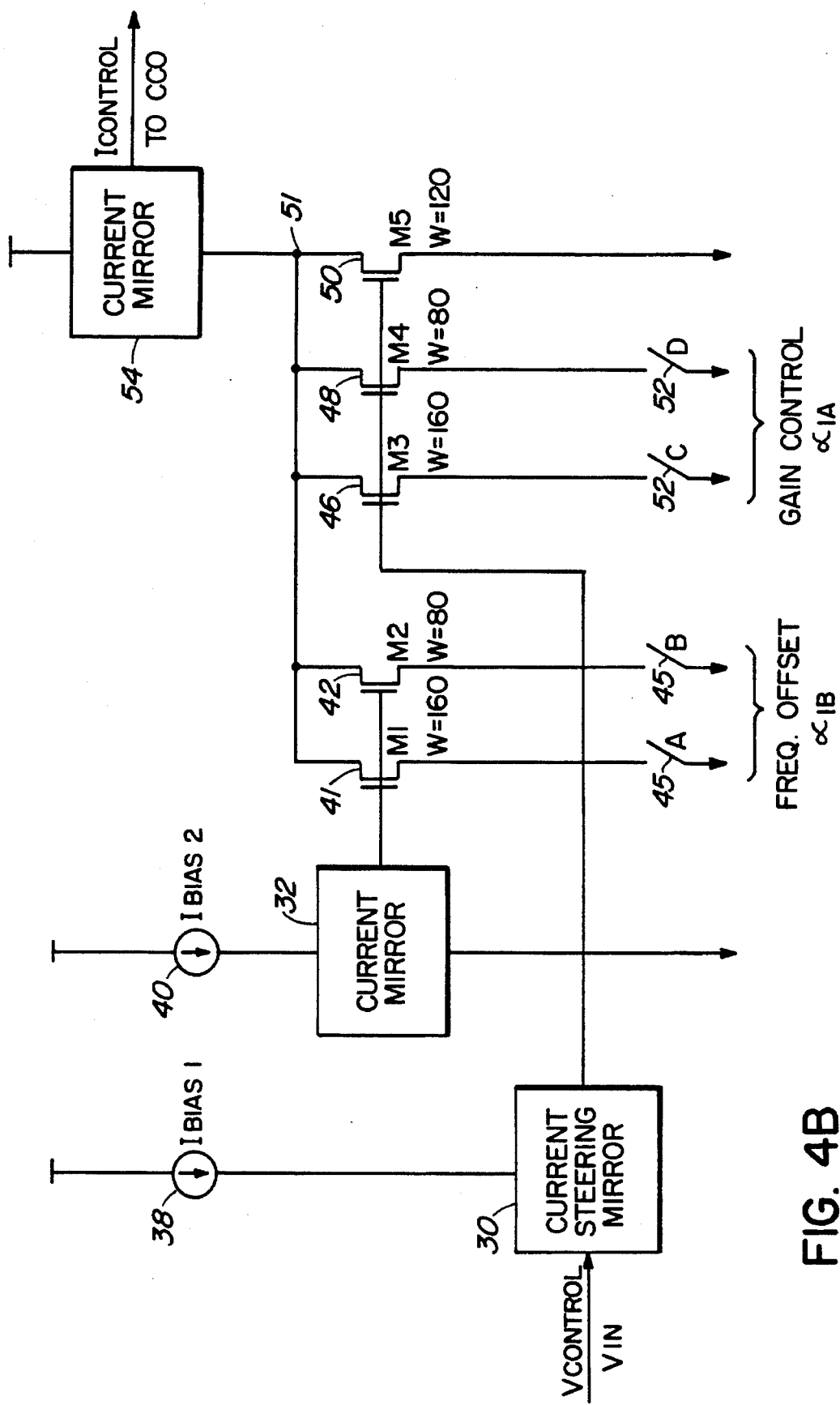

Realization of the circuit of FIG. 4a according to one embodiment is shown in FIG. 4b. The input control voltage e.g. from a charge pump in a phase locked loop is applied to current steering mirror 30 which receives bias current from current source 38. Current mirror 32 receives bias current $I_{bias2}$ from current source 40.

Current mirror 32 controls the gates of field effect transistors 41 and 42. The sources of transistors 41, 42 are connected to ground via programmable switches 45. Current steering mirror 30 controls the gates of field effect transistors 46, 48 and 50. The sources and drains of transistors 46 and 48 are connected via programmable switches 52 to ground.

The drains of transistors 40, 42, 46, 48 and 50 are connected together at a mutual sum point 51. This mutual sum point is connected to the input of current mirror 54, the output of which is a current control voltage for application to the input of a current controlled oscillator, e.g. 36 as shown in FIG. 4a.

Programmable switches 45 control the frequency offset of the current controlled oscillator, and programmable switches 52 provide a digital gain control for the current controlled oscillator.

Now the basic control equation for the above circuit is as follows:

$$f = \alpha_2(V_{in}\alpha_{1a}/\!\!\!\nearrow I_{bias} + \alpha_{1b}/\!\!\!\nearrow I_{bias2})$$

$\alpha_2$=fixed $\alpha_{1a}$=programmable $\alpha_{1b}$=programmable and wherein $/\!\!\!\nearrow$ designates programmability of the gain factor.

It may be seen that the gain constants in this structure are digitally programmable by using binary-weighted current mirror transistors within the voltage to current converter block of the phase locked loop. Transistor 50 is also preferably always included regardless of the programming bits, in order to inject a minimum current into the sum point, and thus establish an initialization frequency control current.

Figure 5:
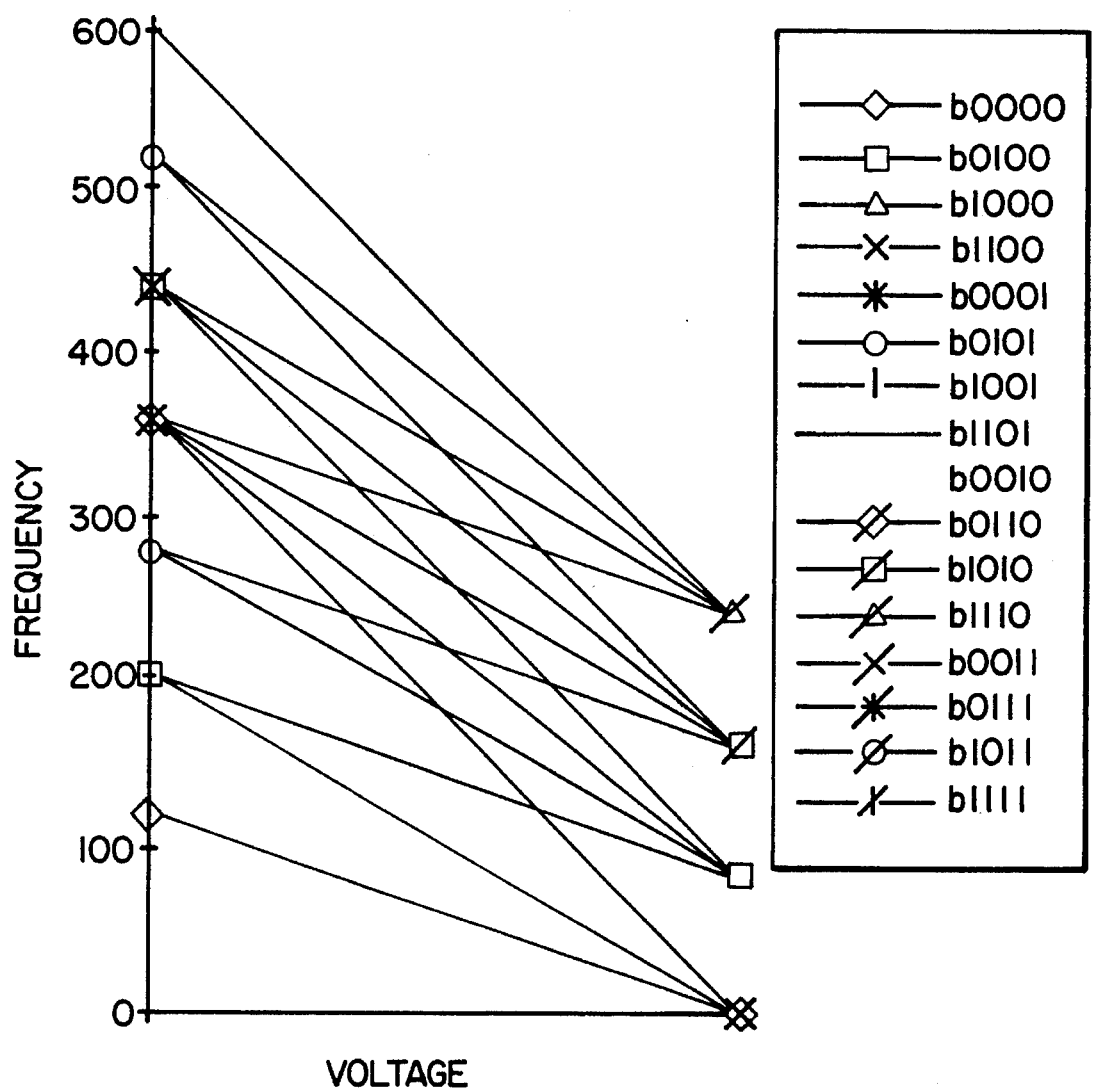

With two bits of control for each of $\alpha_{1a}$ and $\alpha_{1b}$, the frequency/voltage transfer curves are as shown in FIG. 5. It may be seen that a wide and digitally controllable frequency may be obtained without requiring variation of the device sizes, without switching in delay elements within the oscillator, without changing current mirror ratios within the oscillator, and without altering the master bias current. The frequency range may be adjusted independently of the gain, allowing for high frequency operation with moderate gain factors. A more easily and more definitely controllable phase locked loop results.

A person understanding this invention may now conceive of alternative structures and embodiments or variations of the above. All of those which fall within the scope of the claims appended hereto are considered to be part of the present invention.

We claim:

1. A voltage to current converter comprising:
   (a) a first current steering mirror for receiving an input voltage signal and converting the voltage signal to an output current, and comprising first binary weighted current mirror transistors,
   (b) a second current mirror for generating a selectable output current, the second current mirror comprising second binary weighted current mirror transistors,
   (c) means for adding the output currents, and
   (d) means for providing the added output currents to a control input of a current controlled oscillator.

2. A voltage to current converter as defined in claim 1 in which the binary weighted transistors comprise of a plural field effect transistors connected in parallel in a group of said first binary weighted transistors and in a group of said second binary weighted transistors, and plural switches, each being connected to a corresponding one of said binary weighted transistors for switching it operationally into a corresponding group, whereby binary weighting of the binary weighted transistors is provided by means of operation of said switches.

3. A voltage to current converter as defined in claim 2 in which the switches connected to said first binary weighted transistors control the amount of current injected into and removed from the adding means, whereby the amplitude of the added output currents can be increased or decreased, thus controlling the frequency of the controlled oscillator.

4. A voltage to current converter as defined in claim 3 in which said swatches are electronic switches controlled by programmed signals.

5. A voltage to current converter as defined in claim 3 further including a minimum gain setting transistor connected in parallel with said first and second group of binary weighted transistors for injecting a predetermined amount of current into said adding means.

6. A converter comprising a voltage to current converter, means for controlling a gain of voltage to current converter, a separate current generator, means for controlling current emitted from the current generator, means for adding output current signals of the voltage to current converter and the current generator and for providing a sum signal to a current controlled oscillator.

7. A converter as defined in claim 6 in which said means for controlling the gain and said means for controlling the current are programmable.

8. A converter as defined in claim 7 in which the voltage to current converter is a current steering mirror having a first set of current mirror transistors which are program switchable into said current steering mirror, and in which the current generator is a current mirror having a second set of current mirror transistors which are program switchable into said current mirror.

9. A voltage to current converter as defined in claim 8 further including a minimum gain setting transistor connected in parallel with said first and second sets of transistors for injecting a predetermined amount of current into said adding means.

10. A phase locked loop comprising a phase-frequency detector, means for providing a reference signal and a controlled signal to said detector, means for providing a voltage signal resulting from said detector detecting a difference between the phases of the reference and controlled signals, a first current steering mirror for receiving said voltage signal and converting the voltage signal to an output current, and comprising first binary weighted current mirror comprising second current mirror for generating a selectable output current, the second current mirror being comprised of second binary weighted current mirror transistors, means for adding the output currents, means for providing the added output currents to a control input of a current controlled oscillator, and means for providing an output signal of said oscillator as said controlled signal to said detector.

11. A phase locked loop as defined in claim 10, in which the binary weighted transistors comprising of plural field effect transistors connected in parallel in a group of said first binary weighted transistors and in a group of said second binary weighted transistors, and plural switches, each being connected in series with a corresponding one of said binary weighted transistors for switching it operationally into a corresponding group, whereby binary weighting of the binary weighted transistors is provided by means of operation of said switches.

12. A phase locked loop as defined in claim 11 in which the switches connected to said first binary weighted transistors control the gain of said loop and the switches connected to said second binary weighted transistors control the amount of current injected into and removed from the adding means, whereby the amplitude of the added output currents can be increased or decreased, thus controlling the frequency the controlled oscillator.

13. A phase locked loop as defined in claim 12 in which said switches are electronic switches controlled by programmed signals.

* * * * *

UNITED STATES PATENT AND TRADEMARK OFFICE
CERTIFICATE OF CORRECTION

PATENT NO.   : 5,459,653
DATED        : October 17, 1995
INVENTOR(S)  : Jim M.N. Seto et al It is certified that error appears in the above-identified patent and that said Letters Patent is hereby corrected as shown below:

```
Column 5, line 27, delete "a"
         line 27, after "of" insert --the--,
Column 6, line 13, delete "comprising" and insert --transistors, a--,
         line 21, delete "comprising" and insert --comprise--
         line 21, delete "of"
Column 5, line  3, after "comprise" delete "of".
```

Signed and Sealed this

Seventeenth Day of March, 1998

Attest:

BRUCE LEHMAN

Attesting Officer

Commissioner of Patents and Trademarks